United States Patent
Maudet

(10) Patent No.: US 9,924,600 B2
(45) Date of Patent: Mar. 20, 2018

(54) PROCESS FOR MANUFACTURING A PRINTED CIRCUIT BOARD

(71) Applicant: THALES, Courbevoie (FR)

(72) Inventor: Christian Maudet, Cholet (FR)

(73) Assignee: THALES, Courbevoie (FR)

( * ) Notice: Subject to any disclaimer, the term of this patent is extended or adjusted under 35 U.S.C. 154(b) by 227 days.

(21) Appl. No.: 14/763,493

(22) PCT Filed: Jan. 24, 2014

(86) PCT No.: PCT/EP2014/051395
§ 371 (c)(1),
(2) Date: Jul. 24, 2015

(87) PCT Pub. No.: WO2014/114745
PCT Pub. Date: Jul. 31, 2014

(65) Prior Publication Data
US 2015/0366071 A1    Dec. 17, 2015

(30) Foreign Application Priority Data

Jan. 25, 2013  (FR) ...................................... 13 00160

(51) Int. Cl.
*H05K 1/16* (2006.01)
*H05K 3/02* (2006.01)
(Continued)

(52) U.S. Cl.
CPC ............. *H05K 3/027* (2013.01); *H05K 1/186* (2013.01); *H05K 3/0047* (2013.01); *H05K 3/30* (2013.01);
(Continued)

(58) Field of Classification Search
CPC ................. H05K 1/0243; H05K 1/186; H05K 2201/09972; H05K 3/0047; H05K 3/027;
(Continued)

(56) References Cited

U.S. PATENT DOCUMENTS 5,880,591 A * 3/1999 Raymond .......... G01R 1/07364
324/750.25
2004/0145874 A1    7/2004 Pinel et al.
(Continued)

FOREIGN PATENT DOCUMENTS

EP         2 477 466 A2    7/2012
WO     2011/003123 A1    1/2011

*Primary Examiner* — Minh Trinh
(74) *Attorney, Agent, or Firm* — Baker & Hostetler LLP

(57) ABSTRACT

A process for manufacturing a printed circuit board, comprising a first main circuit board having a first structure, comprises steps suitable for inserting one or more secondary printed circuit boards having a different structure from that of the main printed circuit board, comprising: defining one or more cavities suitable for receiving the one or more inserts; preparing the one or more inserts comprising, on at least one side intended to make contact with a wall of the cavity, etched features and a metallization, and one or more vias; inserting the one or more inserts into the one or more cavities in the main circuit board; placing a resin in the one or more cavities to ensure cohesion of the assembly formed by the main circuit board and the one or more secondary circuit boards; laminating the assembly formed by the one or more inserts placed in the main circuit board.

11 Claims, 7 Drawing Sheets

(51) Int. Cl.
    *H05K 1/18*    (2006.01)
    *H05K 3/46*    (2006.01)
    *H05K 3/00*    (2006.01)
    *H05K 3/30*    (2006.01)
    *H05K 3/36*    (2006.01)
    *H05K 1/02*    (2006.01)

(52) U.S. Cl.
    CPC ............ *H05K 3/36* (2013.01); *H05K 3/4611* (2013.01); *H05K 3/4694* (2013.01); *H05K 1/0243* (2013.01); *H05K 2201/09972* (2013.01); *Y10T 29/49128* (2015.01)

(58) Field of Classification Search
    CPC .......... H05K 3/30; H05K 3/36; H05K 3/4611; H05K 3/4694
    See application file for complete search history.

(56) References Cited

U.S. PATENT DOCUMENTS

2006/0214278 A1   9/2006   Martin
2007/0030628 A1   2/2007   Yamamoto et al.
2009/0283312 A1   11/2009  Takahashi \* cited by examiner

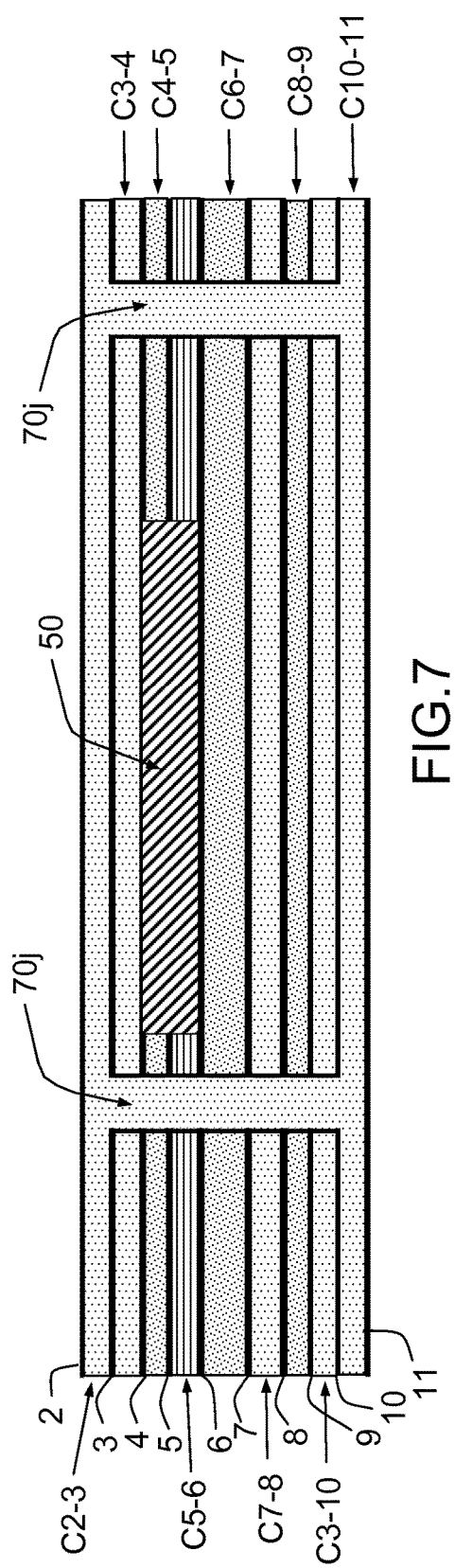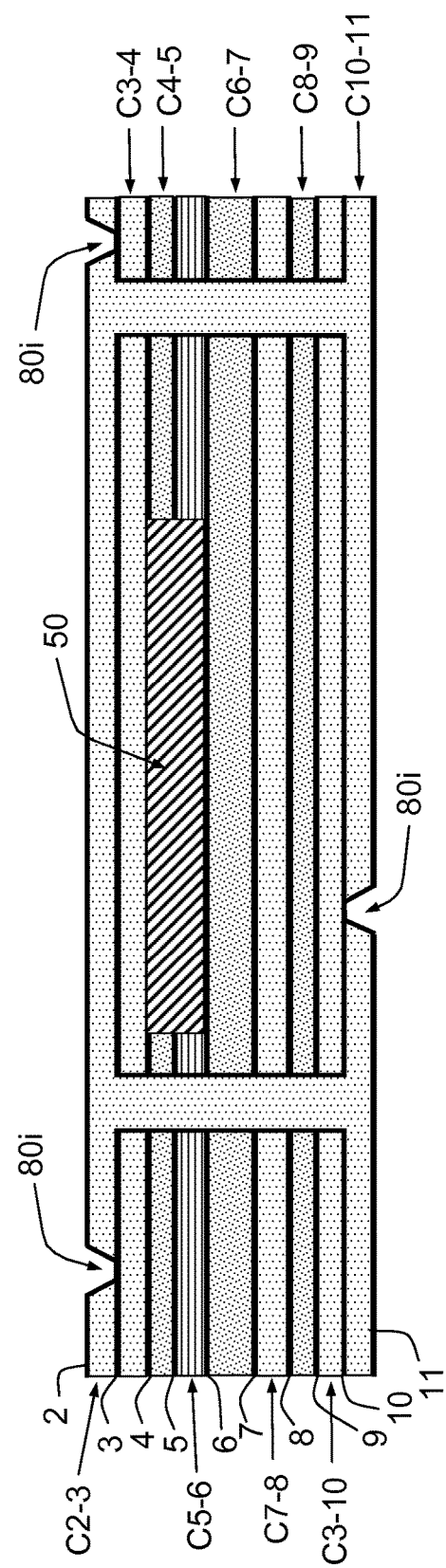

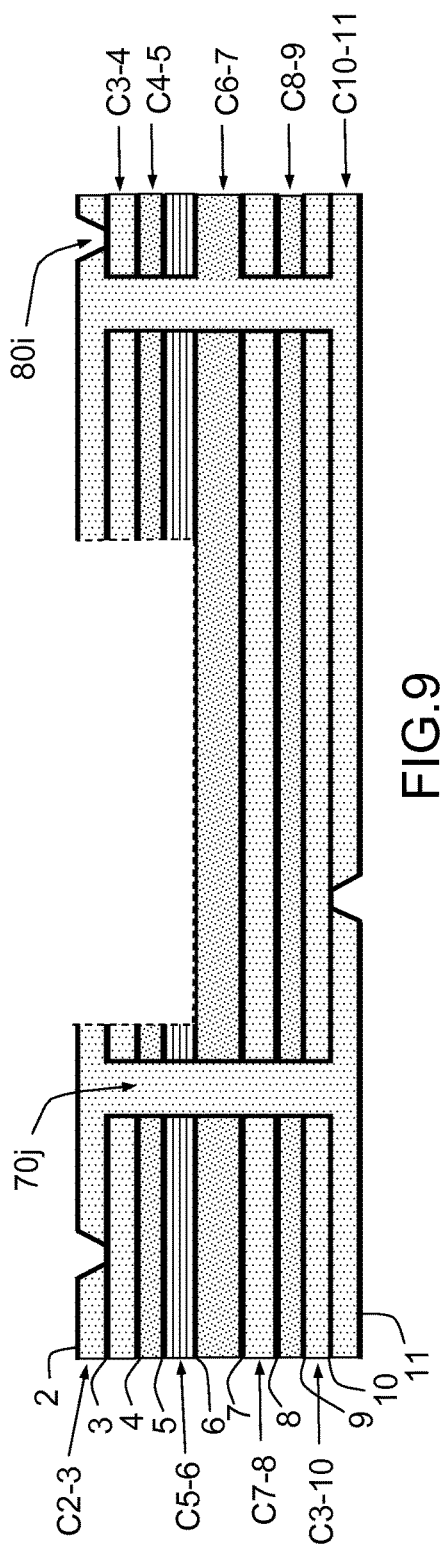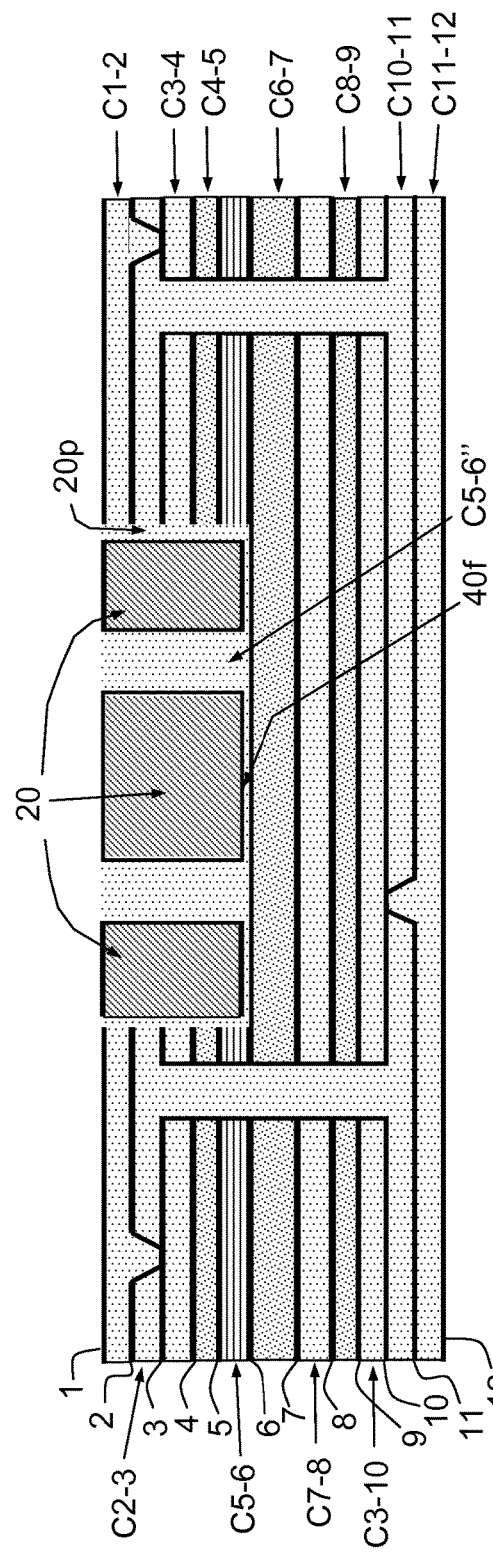

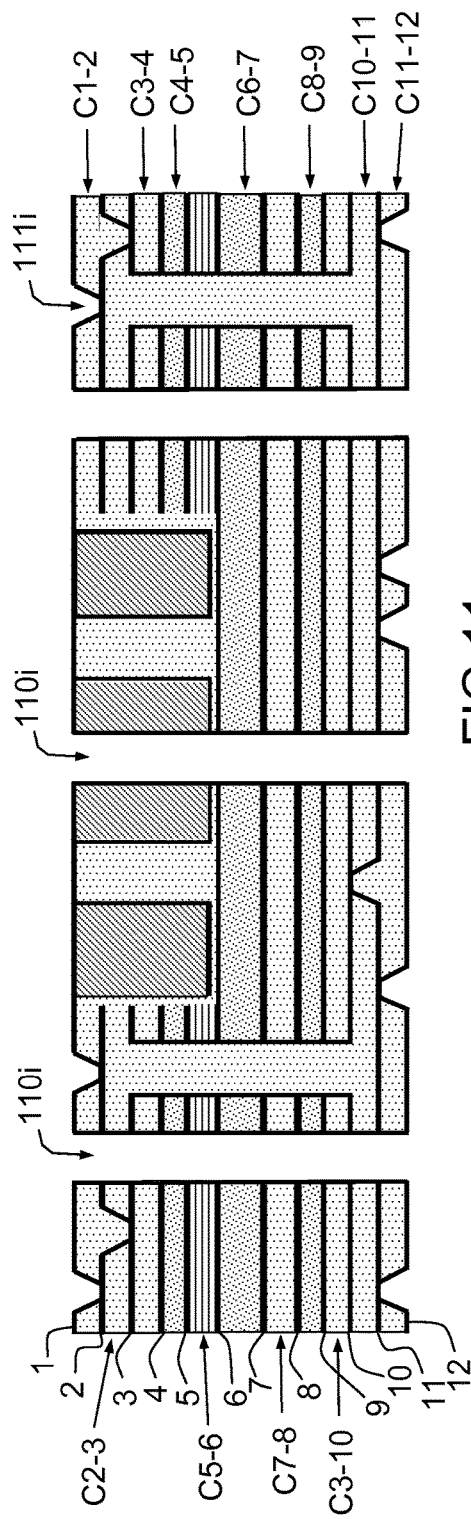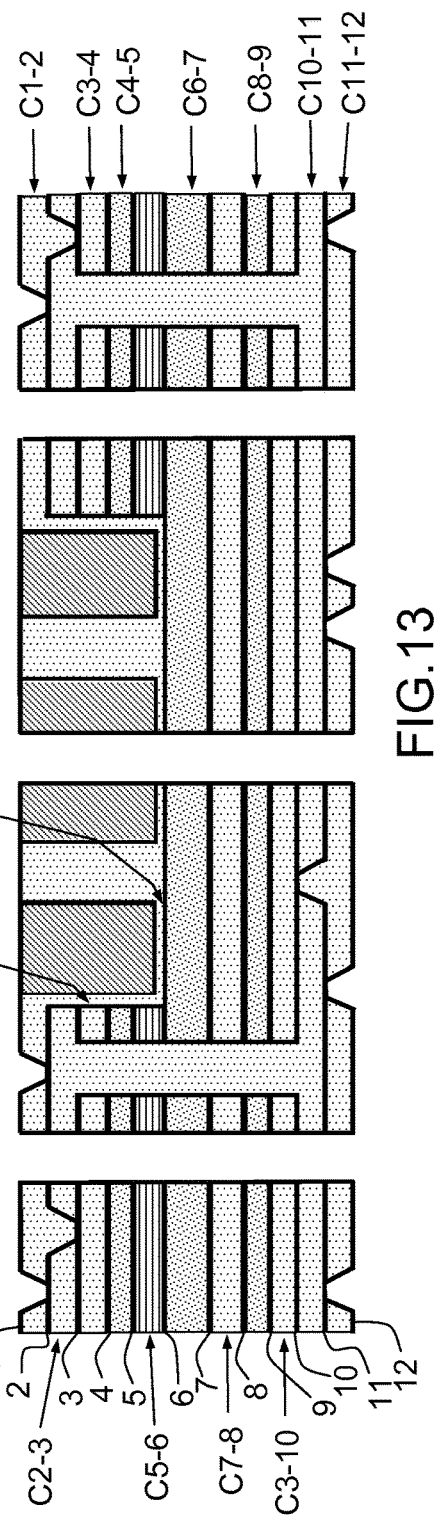

PROCESS FOR MANUFACTURING A PRINTED CIRCUIT BOARD

CROSS-REFERENCE TO RELATED APPLICATIONS

This application is a National Stage of International patent application PCT/EP2014/051395, filed on Jan. 24, 2014, which claims priority to foreign French patent application No. FR 1300160, filed on Jan. 25, 2013, the disclosures of which are incorporated by reference in their entirety.

FIELD OF THE INVENTION

The invention relates to a process for manufacturing a printed circuit board, referred to as the main circuit board, comprising one or more secondary printed circuit boards having a different structure from that of the main circuit board. The one or more secondary printed circuit boards are inserted into a main printed circuit board during its manufacture.

The invention is for example used in the design and production of hybrid RF or microwave/digital printed circuit boards in the context of high-density designs that require different types of through-holes (for example laser micro-vias in the main circuit board and through- or blind mechanical drill holes in the inserted circuit boards) and heterogeneous dielectrics to be used.

BACKGROUND

In the rest of the description, the expression "main printed circuit board" will be understood to mean the circuit board into which one or more secondary circuit boards having a different structure are to be inserted.

The need to simultaneously provide digital functions and RF/microwave functions on the same board is difficult or even impossible to meet when the components, because of their digital functions or their high density, require the use of laser micro-vias, or even the use of dielectrics of types and thicknesses specific to each of the envisioned circuit functions. For example, micro-vias imply the use of a thin dielectric between the layers connected thereby, which thickness will in addition vary between the various zones of the printed circuit board depending on the number and type of vias. These small thicknesses and these variations are incompatible with the dielectric requirements of radio-frequency functions, which require a large thickness and a high Z-axis dimensional stability the entire length of matched signal paths, the coordinate system being known to those skilled in the art. In addition, the properties of the dielectrics used with micro-vias are unsuitable or not entirely suitable for RF signals. These contradictory requirements lead to different and separate printed circuit boards being designed for the RF/microwave functions and digital functions. This leads to a significant increase in the design and manufacturing cost of the assembly, which limits the potential for increasing the number of components and therefore functions (densification).

A first approach is to produce the digital functions and RF/microwave functions on different circuit boards, which are then connected using appropriate processes after the components of each of the circuit boards have been put in place. Another approach consists in defining an "average" structure better suited to the RF functions, but this greatly limits the capacity to integrate digital functions and often the choice of the associated components. Managing the RF/microwave and digital functions separately substantially increases cost and limits the scope for integration.

One of the objectives of the present invention is to provide a process for manufacturing a printed circuit board, especially allowing the technical problems of the prior art to be solved by integrating, during the step of manufacturing a bare main printed circuit board, inserts or secondary printed circuit boards of different structure from that of the main printed circuit board, thereby providing a single flat surface for component connection corresponding to one of the external sides of the main circuit board continued by one of the external faces of the secondary circuit board, and producing interconnecting metalized holes along the Z-axis of these two circuit boards.

The term "structure" when used with regard to a printed circuit board for example means that a digital, radio-frequency, microwave, etc. function, is associated therewith.

SUMMARY OF THE INVENTION

The invention relates to a process for manufacturing a printed circuit board comprising a first main circuit board N having a first structure, characterized in that it comprises a succession of steps suitable for inserting one or more secondary printed circuit boards RF having a different structure from that of the main printed circuit board, said steps comprising:
  a step in which one or more cavities suitable for receiving one or more inserts are defined;
  a step of preparing the one or more inserts comprising, on at least one side intended to make contact with a wall of the cavity, etched features and a metallization and one or more vias;
  a step of placing a second resin in the one or more cavities in order to ensure the cohesion of the assembly formed by the main circuit board and the one or more secondary circuit boards;
  a step of inserting the one or more inserts into the one or more cavities of said main circuit board, in which step the second resin diffuses into the vias then around the periphery of the insert;
  a step of laminating the assembly formed by the one or more inserts placed in the main circuit board and a step of grinding and polishing the surface of the printed circuit board in order to form through-holes then drilling the layers forming the printed circuit board in order to form through-holes, then producing micro-vias before metallization of the assembly by deposition of a deposit, then final etching of features and tracks in external layers.

The implemented steps especially allow electrical continuity to be ensured across the entirety of the external flat surface of the printed circuit board composed of the main circuit board and its inserts but also between all the layers of the printed circuit board composed of the main circuit board and its inserts, including in the zone of the inserts—by way of the final drilling/metallization.

According to one variant embodiment the printed circuit board is composed of a plurality of laminates and a copper layer and one or more cavities are produced in the laminates of the printed circuit board by forming an aperture in an external copper layer, in an epoxy layer, in an epoxy laminate layer and in an epoxy prepreg layer that is composed of a resin that does not flow and that does not diffuse into the orifices in the circuit board.

According to one variant embodiment, the first printed circuit board comprises at least a plurality of laminate layers, each laminated layer comprising a copper layer on each of its sides, a plurality of prepreg layers being placed between the laminate layers, and the process comprises at least the following steps:
   a) for the first printed circuit board, etching the internal copper layers of the laminate layers with the desired features and tracks;
   b) producing at least one aperture in the main circuit board, corresponding to the size of the one or more inserts;
   c) preparing the one or more inserts intended to be inserted into the one or more apertures by etching and metallizing a side of the insert which will make contact with the bottom of the aperture, and by drilling one or more vias;
   d) cutting at least one layer composed of a first resin that does not flow to a size tailored to the size of the one or more inserts;
   e) assembling the layers and the prepregs, a shim being inserted into the aperture, then laminating the assembly;
   f) drilling the laminated assembly in order to define one or k vias, metallizing the assembly and etching the features and tracks envisaged for the printed circuit board, and generating a plurality of micro-vias;
   g) removing the one or more shims and assembling the one or more inserts in the main circuit board by positioning the inserts on a prepreg that flows; and
   h) laminating the assembly before metallization, deposition on and etching of the external layers.

The process may comprise a step in which two epoxy prepreg layers and two copper layers are added before the lamination step is carried out.

The method uses a laser technique to produce the micro-vias.

It is possible to remove the shim by mechanical machining or cutting.

According to one variant, one or more edges of an insert are metalized. According to another variant, one or more walls of the cavity are metalized. According to another variant, the edges and bottom of a cavity are metalized.

The insert is, for example, an RF insert.

BRIEF DESCRIPTION OF THE DRAWINGS

Other features and advantages of the device according to the invention will become more clearly apparent on reading the following description of one exemplary embodiment given by way of completely non-limiting illustration and with reference to the appended figures, which show:

FIGS. 2 to 11, various cross-sectional views, corresponding to steps of the process;

FIG. 13, another variant in which the cavity that receives the insert has its walls metalized.

DETAILED DESCRIPTION

In order to ensure the principle implemented by the process according to the invention is better understood, the following example is given for the manufacture of a main printed circuit board having a first structure integrating digital functions, into which one or more RF inserts or secondary circuit boards having a structure different from the first structure of the main circuit board are inserted. The opposite is also possible without departing from the scope of the invention, the RF circuit board becoming the main circuit board and the inserts corresponding to the digital functions.

Is also possible to depart from the RF field and produce printed circuit boards having a first structure into which one or more printed circuit boards having a second structure different from the first are inserted.

Figure 1:
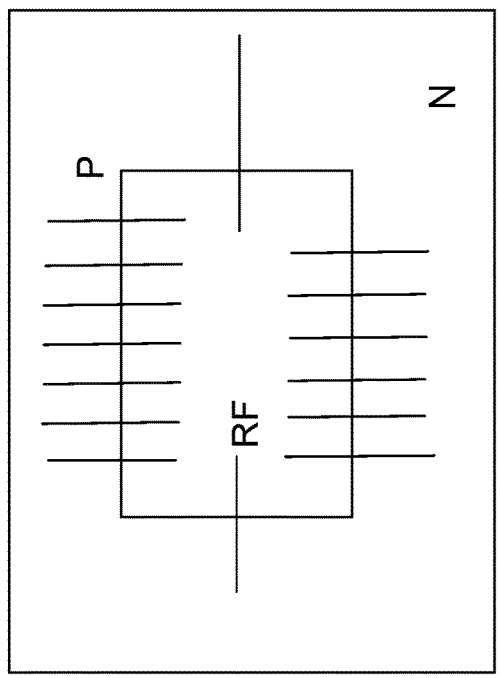
FIG. 1, a view of a printed circuit board obtained by the manufacturing process according to the invention.

FIG. 1 shows a schematic top view of a printed circuit board obtained by implementing the process according to the invention. It comprises a very-high-density digital circuit board, the construction of which is detailed below. The digital circuit board N is composed of multilayers and multiple ground planes and internal supplies (not shown for the sake of simplicity, such a layout being well known to those skilled in the art). The dielectric used is for example a thin epoxy or polyimide dielectric. It comprises small through-vias and micro-vias. An RF/microwave circuit board of very high RF sensitivity is integrated into the printed circuit board. The RF circuit board is a double-sided circuit board in this example. FIG. 1 schematically shows a plurality of tracks P illustrating the electrical continuity across the external layer between zones of the digital circuit board N and zones of the RF circuit board. The materials used to manufacture the insert are RF materials. The circuit board obtained also comprises through-vias and wide tracks for signal matching.

In the example given in the following figures, the RF/microwave functions are pre-manufactured then inserted into a digital architecture.

Figure 2:
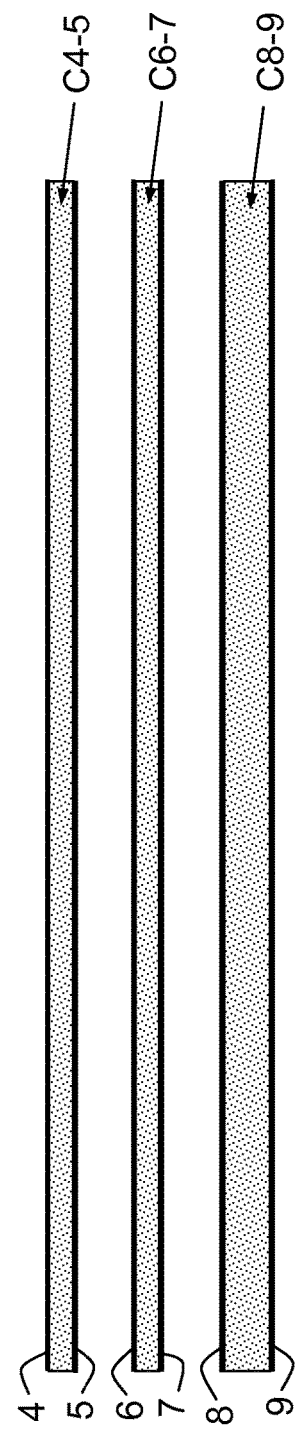

FIG. 2 shows a first step of the process, in the case of 3 epoxy laminates C4-5, C6-7 and C8-9. Each laminate comprises on its bottom side and on its topside, a copper layer, for example C4-5, which is covered with a top copper layer 4 and a bottom copper layer 5. Identically, 6 and 7 correspond to the copper layers of the laminate C6-7 and 8 and 9 to the copper layers of the layer C8-9. Step 1) consists in etching these internal copper layers with the features and tracks desired for the intended use.

Figure 3:
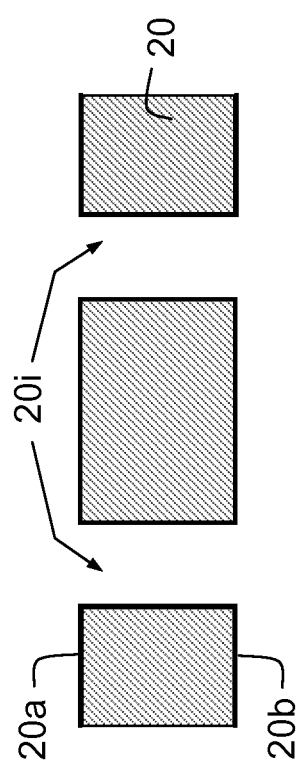

In parallel, in step 2 (FIG. 3), the insert to be inserted will be prepared. The RF/microwave insert 20 intended to be inserted in the printed circuit board N in FIG. 2 is drilled mechanically. The mechanical drilling consists in producing vias 20i. After the drilling, the process continues with metallization of these vias and the layers 20a, 20b of the sides of the insert. The layer 20a corresponds to what is referred to as the external layer, which does not make contact with the internal or external walls of the cavity. After metallization, the internal side 20b of the insert, i.e. the face making contact with bottom of the cavity in which the insert is positioned, is etched with the desired features. The insert is given a size and shape chosen depending on the final application.

Figure 4:
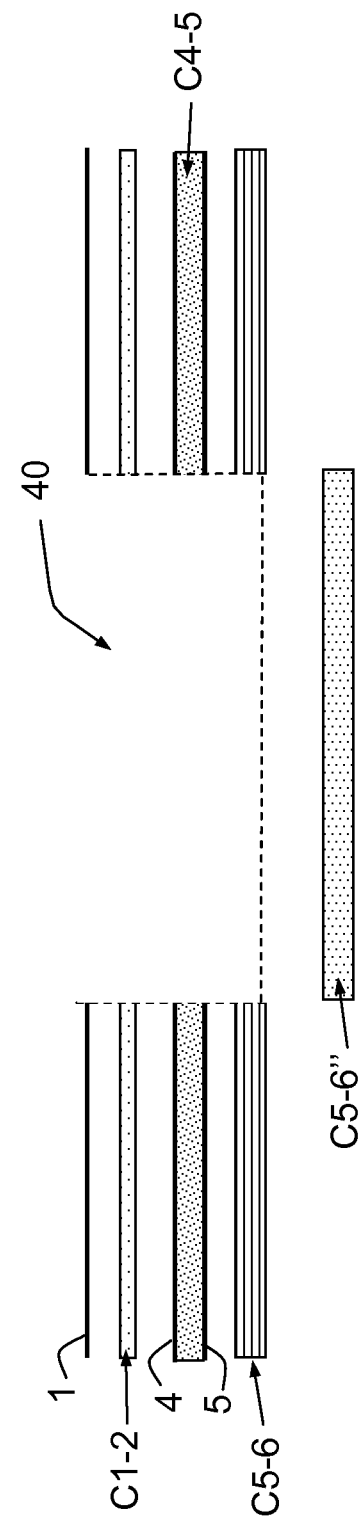

FIG. 4 schematically shows step 3 in which an aperture or cavity 40 is produced in the laminates or prepregs of the printed circuit board, corresponding to the size and location of the insert 20. The aperture is produced using a technique known to those skilled in the art, in an external copper layer 1, in an epoxy layer C1-2, in the epoxy laminate layer C4, 5 and in an epoxy prepreg layer C5-6, one of the particularities of which is to be composed of a resin, or first resin, that does not flow and that does not diffuse into the orifices in the circuit board.

FIG. 4 also shows the cutting (step 4) of a prepreg C5-6" or second resin to the size of the insert 20, which is chosen to have a resin content tailored to allow the resin to flow and to ensure the insert is correctly positioned along the Z-axis.

Figure 5:
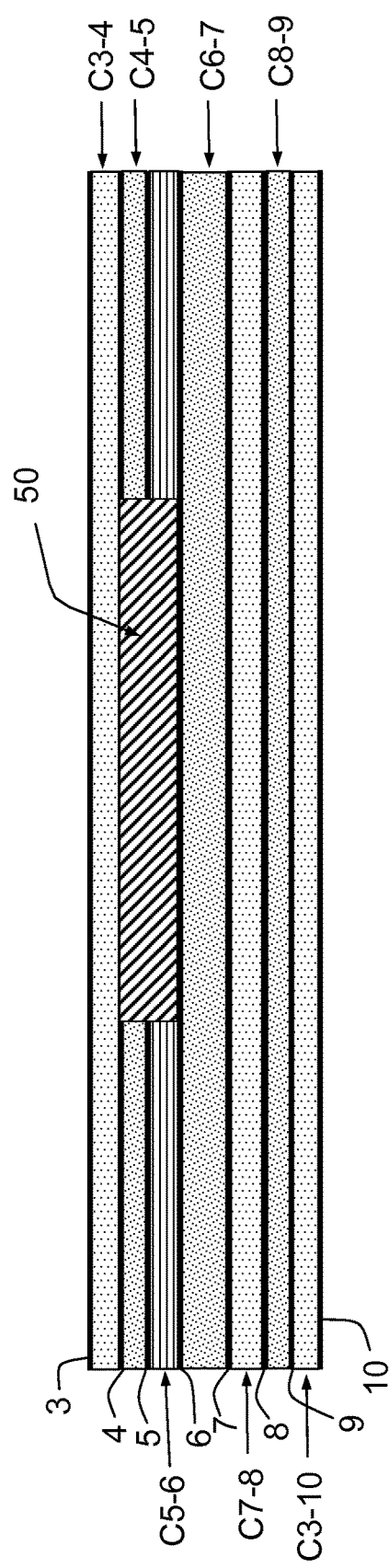

FIG. 5 shows (step 5) the assembly of the layers C4-5, C6-7, C8-9 with the prepregs C3-4, C5-6, C7-8, C9-10, a shim 50 being inserted into the aperture 40 in order to preserve the size and shape of the aperture formed. Next, a copper layer 3, 10 is deposited on the top layer C3-4 and on the bottom layer C9-10 of the circuit board formed by assembling the layers and the assembly is laminated.

Figure 6:
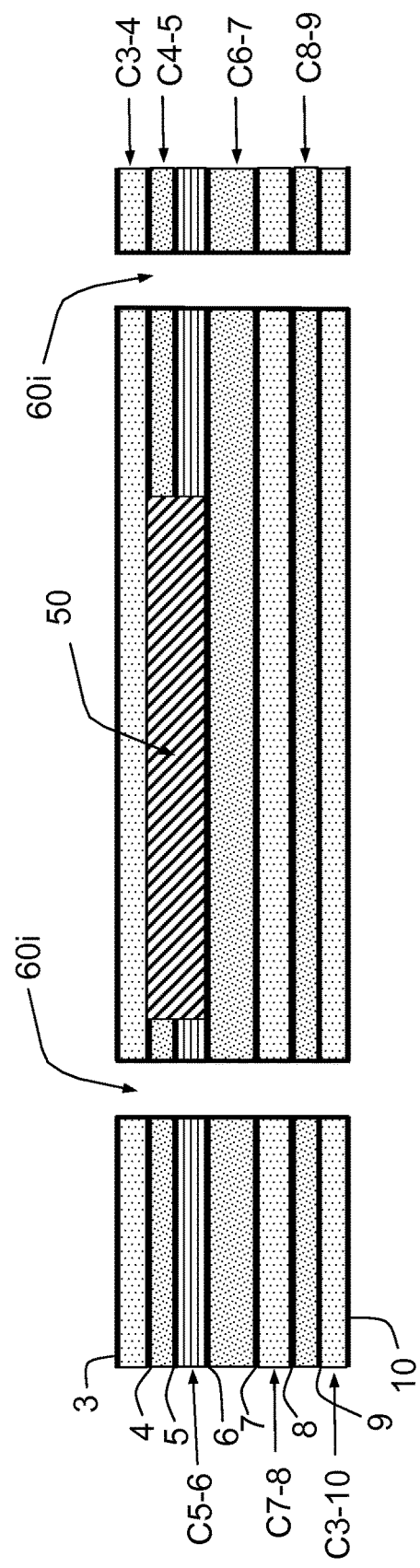

FIG. 6 schematically shows step 6 of mechanically drilling the assembly laminated in FIG. 5 in order to define one or more, k, vias 60i, the number and dimensions of which are defined beforehand depending on the design of the printed circuit board. The following step consists in metallizing the assembly with a copper deposit deposited in the vias 60i and on the copper layers 3, 10. The following step consists in etching the features and tracks envisaged for the printed circuit board in these layers 3 and 10.

In FIG. 7 (step 7) two epoxy prepreg layers C2-3, C10-11 and two copper layers 2 and 10 have been added on either side of the circuit board in FIG. 6 before carrying out a lamination step. The resin of the epoxy layers C2-3 and C10-11 will flow into the vias 60i during the pressing cycle.

In the following step, step 8 (FIG. 8), the external layers C2-3, C10-11 of the printed circuit board are drilled by laser drilling in order to create micro-vias 80i, then a copper deposit is deposited on the layers C2-3 and C10-11. The deposition of the copper deposit especially allows the micro-vias to be metalized. The following step consists in etching the features and tracks envisaged for the printed circuit board in the copper layers 2 and 11.

FIG. 9 shows step 9, which consists in removing the shim 50, for example by mechanical machining or by cutting. This step makes use of known techniques employing mechanical detection of the zone to be removed.

Step 10, illustrated in FIG. 10, comprises a step of assembling the insert 20 and the printed circuit board. The layers or prepregs C1-2, C11-12, the copper layers 1, 12 and the prepreg C5-6" of the size of the insert placed on the bottom 40f of the cavity 40 are assembled using a technique known to those skilled in the art. Then the insert 20 is positioned before the assembly is laminated. In step 10, the resin of the prepregs will diffuse into the vias, then around the periphery 20p of the insert 20. The resin having risen, the process will implement a step of grinding and polishing the surface of the printed circuit board.

FIG. 11 shows (step 11) mechanical drilling of the layers forming the printed circuit board, in order to form through-holes 110i, then laser drilling of the layers C1-2, C11-12, in order to produce a plurality of micro-vias 111i. The following step consists in metallizing the assembly by depositing a copper deposit, thereby especially allowing the through-holes to be metalized, then in etching features and tracks in the external copper layers. The through-holes 110i allow connections to be made between the main circuit board and the insert along the Z-axis.

Figure 12A:
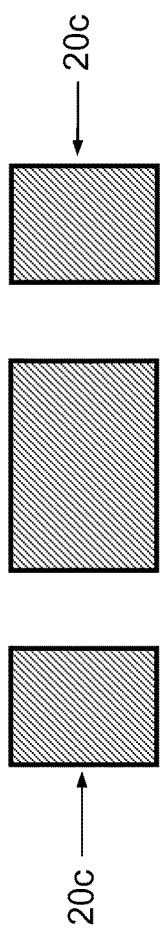
FIGS. 12a and 12b, a variant in which the insert is metalized on its edges.
Figure 12B:
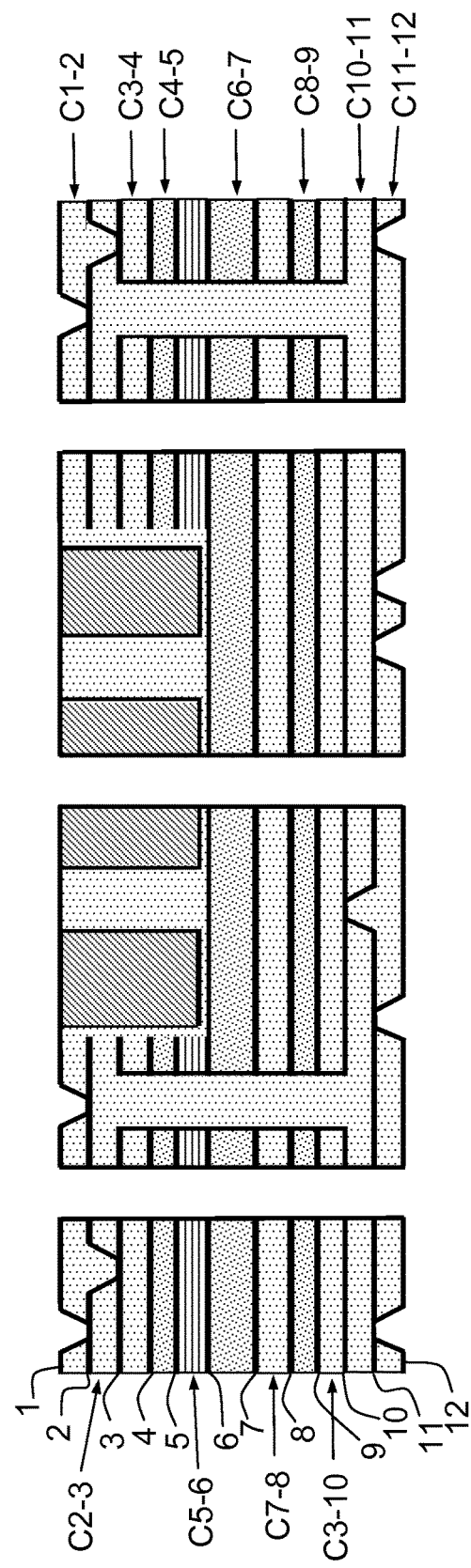

FIGS. 12a and 12b schematically show a variant embodiment in which the process comprises a step of metalizing the edges 20C or sides of the insert before its insertion into the cavity of the printed circuit board. This variant especially makes it possible to obtain an electrical continuity and shielding of signals in the circuit board. Thus, the signals of the digital portion of the circuit board are separated from the RF signals of the insert and interference is limited.

FIG. 13 shows a variant of the process in which the cavity 40 is metalized using a technique known to those skilled in the art before the first micro-vias are produced. The edges 40b and bottom 40f of the cavity will for example be metalized. This allows the digital circuit board to be better isolated from the RF insert.

According to another variant embodiment, it is possible to insert an insert having metalized edges (FIG. 12a) into a cavity the edges and bottom of which have been metalized. This variant provides effective shielding between the digital signals and the RF/microwave signals. Furthermore, such an embodiment allows effective ground plane management to be implemented.

The examples described above are applicable to any type of printed circuit board comprising a circuit board having a first architecture and into which one or more circuit boards having different architectures are inserted.

Inserts may be inserted into both sides of a printed circuit board, i.e. into the top and bottom sides.

The inserts may be located anywhere on the surface of the main circuit board. Placement on one edge of the main circuit board especially allows delivery of the RF signals to be facilitated.

The process according to the invention by mixing, during the step of manufacturing the bare printed circuit board, various architectures, especially allows, when there is a simultaneous need for digital and RF/microwave architectures, the number of printed circuit boards to be limited. It allows the structure of electronic subassemblies to be simplified by decreasing the number of boards. It simplifies the interconnect technology required to interconnect the various functions.

The process according to the invention especially allows hybrid, for example digital/RF or digital/microwave, modules to be densified.

The approach described especially allows digital and/or RF/microwave supplies and grounds to be treated in an optimal way and in addition makes it possible to metalize the edge face of these inserts without requiring production of the printed circuit board to be rejigged.

The invention claimed is:

1. A process for manufacturing a printed circuit board assembly comprising a main circuit board and one or more inserts of secondary printed circuit boards having a different structure than the main circuit board, said process comprising:
   providing the main circuit board;
   defining one or more cavities in the main circuit board;
   providing the one or more inserts of secondary printed circuit boards;
   drilling one or more vias into at least one side of the one or more inserts of secondary printed circuit boards,
   etching features into the at least one side of the one or more inserts of secondary printed circuit boards, and
   metallizing the at least one side of the one or more inserts of secondary printed circuit boards;
   placing a second resin in the one or more cavities of the main circuit board;
   inserting the one or more inserts of secondary printed circuit boards into the one or more cavities in said main circuit board to form the printed circuit board assembly, wherein the second resin diffuses into the vias and around a periphery of the one or more inserts of secondary printed circuit boards to ensure electrical continuity;
   laminating the printed circuit board assembly;
   grinding and polishing a surface of the printed circuit board assembly;
   drilling layers of the printed circuit board assembly to form through-holes;

drilling a plurality of micro-vias into the printed circuit board assembly;

metallizing the printed circuit board assembly by deposition of a deposit; and etching features and tracks into external layers to ensure electrical continuity of the external layers between the main circuit board and the one or more inserts of secondary printed circuit boards.

2. The process of claim 1, wherein producing the one or more cavities includes forming an aperture in a plurality of layers of the main circuit board, the plurality of layers including an external copper layer, an epoxy layer, an epoxy laminate layer, and an epoxy prepreg layer that is composed of a resin that does not flow or diffuse into the vias in the one or more inserts of secondary printed circuit boards.

3. The process of claim 1, wherein the main circuit board comprises a plurality of laminate layers, each laminated layer comprising a copper layer on each side, a plurality of prepreg layers in between the laminate layers, the process further comprising:

etching the copper layers of the laminate layers with features and tracks;

cutting a first resin, wherein the first resin does not flow;

assembling the layers to form an assembly;

inserting one or more shim into the one or more cavities of the main circuit board;

laminating the assembly;

drilling the laminated assembly to form one or more k vias;

generating a plurality of micro-vias; and removing the one or more shims and assembling the one or more inserts of secondary printed circuit boards in the main circuit board by positioning the inserts of secondary printed circuit boards on prepreg layers that flow.

4. The process of claim 3, further comprising adding two epoxy prepreg layers and two copper layers before laminating.

5. The process of claim 3, wherein the prepreg layers that flow are-positioned at a bottom of the cavities and have a resin content tailored to allow the resin to flow and to ensure the one or more inserts of secondary printed circuit boards is correctly positioned.

6. The process of claim 3, wherein the one or more shims is removed by mechanical machining or cutting.

7. The process of claim 1, further comprising using a laser technique to produce the micro-vias.

8. The process of claim 1, further comprising metalizing one or more edges of the one or more inserts of secondary printed circuit boards.

9. The process of claim 1, further comprising metalizing one or more walls of the cavity.

10. The process of claim 1, further comprising metalizing edges and a bottom of the cavity.

11. The process of claim 1, wherein the one or more inserts of secondary printed circuit boards includes an RF insert.

* * * * *